(12) United States Patent
Cheng et al.

(10) Patent No.: US 10,522,344 B2
(45) Date of Patent: Dec. 31, 2019

(54) INTEGRATED CIRCUITS WITH DOPED GATE DIELECTRICS

(71) Applicant: Taiwan Semiconductor Manufacturing Co., Ltd., Hsinchu (TW)

(72) Inventors: Chung-Liang Cheng, Changhua County (TW); Yen-Yu Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/804,575

(22) Filed: Nov. 6, 2017

(65) Prior Publication Data
US 2019/0139759 A1 May 9, 2019

(51) Int. Cl.
| | |
|---|---|
| H01L 29/66 | (2006.01) |
| H01L 29/78 | (2006.01) |
| H01L 21/285 | (2006.01) |
| H01L 21/8238 | (2006.01) |
| H01L 29/51 | (2006.01) |

(Continued)

(52) U.S. Cl.
CPC .. *H01L 21/02362* (2013.01); *H01L 21/02321* (2013.01); *H01L 21/28185* (2013.01); *H01L 21/28194* (2013.01); *H01L 21/28211* (2013.01); *H01L 29/517* (2013.01); *H01L 29/66545* (2013.01); *H01L 29/4966* (2013.01); *H01L 29/513* (2013.01); *H01L 29/518* (2013.01); *H01L 29/66795* (2013.01)

(58) Field of Classification Search
CPC .......... H01L 27/092; H01L 21/823842; H01L 29/0649; H01L 29/4966; H01L 21/823864; H01L 29/6656
See application file for complete search history.

(56) References Cited

U.S. PATENT DOCUMENTS

| | | | |
|---|---|---|---|
| 8,487,378 | B2 | 7/2013 | Goto et al. |
| 8,729,634 | B2 | 5/2014 | Shen et al. |

(Continued)

FOREIGN PATENT DOCUMENTS

| | | |
|---|---|---|
| TW | 200737362 | 10/2007 |
| TW | 201448052 | 12/2014 |

(Continued)

OTHER PUBLICATIONS

Chiang, Hsin-Che et al., "Semiconductor Device Gate Structure and Method of Fabricating Thereof", U.S. Appl. No. 15/395,901, filed Nov. 11, 2016, 34 pages.

*Primary Examiner* — Brian Turner
(74) *Attorney, Agent, or Firm* — Haynes and Boone, LLP (57) ABSTRACT

Examples of an integrated circuit with a gate structure and a method for forming the integrated circuit are provided herein. In some examples, a workpiece is received that includes a substrate having a channel region. A gate dielectric is formed on the channel region, and a layer containing a dopant is formed on the gate dielectric. The workpiece is annealed to transfer the dopant to the gate dielectric, and the layer is removed after the annealing. In some such examples, after the layer is removed, a work function layer is formed on the gate dielectric and a fill material is formed on the work function layer to form a gate structure.

20 Claims, 9 Drawing Sheets

(51) Int. Cl.
*H01L 21/02* (2006.01)
*H01L 21/28* (2006.01)
*H01L 29/49* (2006.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 2006/0131672 A1* | 6/2006 | Wang ............... H01L 21/28202 257/410 |
| 2007/0152271 A1* | 7/2007 | Dewey .............. H01L 21/28088 257/346 |
| 2007/0218663 A1 | 9/2007 | Hao et al. |
| 2008/0135984 A1 | 6/2008 | Oh |
| 2009/0035909 A1* | 2/2009 | Chang ............. H01L 21/823807 438/276 |
| 2010/0052071 A1* | 3/2010 | Niimi .............. H01L 21/823842 257/369 |
| 2010/0197128 A1* | 8/2010 | Schaeffer ........ H01L 21/823807 438/591 |
| 2013/0049142 A1* | 2/2013 | Liu .................... H01L 29/4983 257/412 |
| 2013/0270646 A1* | 10/2013 | Kim .................. H01L 29/4966 257/369 |
| 2014/0077313 A1* | 3/2014 | Li .................... H01L 21/823842 257/410 |
| 2014/0183666 A1* | 7/2014 | Pramanik ............. H01L 29/401 257/412 |
| 2014/0282326 A1 | 9/2014 | Chen et al. |
| 2015/0132938 A1* | 5/2015 | Ahmed ................ H01L 29/517 438/591 |
| 2016/0086860 A1* | 3/2016 | Kannan ........... H01L 21/823842 438/592 |
| 2016/0225871 A1* | 8/2016 | Cheng ............. H01L 21/823842 |

FOREIGN PATENT DOCUMENTS

| | | |
|---|---|---|
| TW | 201631776 | 9/2016 |
| TW | 201732904 | 9/2017 |

\* cited by examiner

INTEGRATED CIRCUITS WITH DOPED GATE DIELECTRICS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, developments have been made to the gate structures of transistors in integrated circuits. At a high level, a gate structure may include a conductor and a gate dielectric that separates the conductor from a channel region of the transistor. With respect to the gate conductor, developments now allow the use of layers of metal as a substitute for polysilicon in the gate conductor. Whereas polysilicon once replaced metal as a gate conductor because of polysilicon's increased resistance to heat and ease of fabrication, metal is once again replacing polysilicon in part because of metal's higher conductance. In an example, a metal-containing gate conductor includes numerous layers including a number of work function metal layers and a low resistance metal filling layer.

With respect to the dielectric, silicon oxide is a suitable gate dielectric material in some applications. However, as a gate dielectric becomes thinner, charge carriers may tunnel through the dielectric and travel from the gate conductor to the channel region. To address this, high-k dielectrics and other gate dielectrics are being pursued that provide the same or better performance as silicon oxide with a thicker dielectric layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

At its most basic, a transistor may include a semiconductor material doped to form source/drain features separated by a channel region. A gate structure is disposed on the channel region and includes a gate electrode and a gate dielectric that separates the gate electrode from the channel region. While any suitable gate dielectric may be used, many examples of the present disclosure use a high-k dielectric to reduce leakage current, reduce threshold voltage, and/or optimize the operation of the transistor.

In their as-deposited form, some high-k dielectric materials may be have a high degree of interface defects at the interface with the channel region and at the interface with the layers of the gate electrode. These defects may cause variability in device performance as well as make the device more prone to failures such Time Dependent Dielectric Breakdown (TDDB). TDDB is an increase in carrier tunneling through the gate dielectric over time due to use. TDDB is often caused by a conductive path developing within the dielectric material, which reduces the effective thickness of the dielectric. Of course, TDDB is only one type of device failure that may occur due to the gate dielectric. Furthermore, some high-k dielectric materials are sensitive to heat applied during subsequent gate fabrication processes such as the deposition of metal-containing layers on the gate dielectric.

To address these issues and others, some examples of the present disclosure deposit a high-k dielectric material and subsequently dope the high-k material with fluorine or other dopants to passivate the high-k material. This passivation process may reduce interface defects, decrease TDDB, increase thermal stability, and/or otherwise improve the performance of the high-k dielectric. It has been determined that the amount of dopant in the high-k dielectric may be increased by depositing a sacrificial metal-and-dopant-containing layer on the high-k dielectric and annealing to transfer the dopant to the high-k material. Accordingly, some examples provide a method of depositing a high-k dielectric material layer, depositing one or more capping layers on the high-k dielectric material layer, depositing a metal-and-dopant-containing layer, annealing the structure to introduce the dopant to the high-k dielectric material layer, and subsequently removing the metal-and-dopant-containing layer.

In some embodiments, this technique provides greater uniformity even as channel size (and by extension gate size) varies. For example, long channel and short channel devices can, despite differences in gate size, provide the same doping as the sacrificial layer is conformally formed on the dielectric layer (e.g., as opposed to a fill metal which may different in configuration between device types). Further, by introducing the passivating component (e.g., fluorine) by a solid precursor drive-in, some embodiments avoid variations that would be caused by thermal or vapor anneal introduction of the passivating component. Further, introducing the dopant via the sacrificial layer allows for removal of the dopant source after the anneal. In some embodiments, the dopant drive in is performed before forming the work function layers thus reducing the interaction between the dopant and a work function metal, e.g., Al, which may impact the threshold voltage tuning. By these mechanisms and others, these exemplary embodiments may thereby provide improved device performance and reliability. However, unless otherwise noted, no embodiment is required to provide any particular advantage.

Figure 1A:
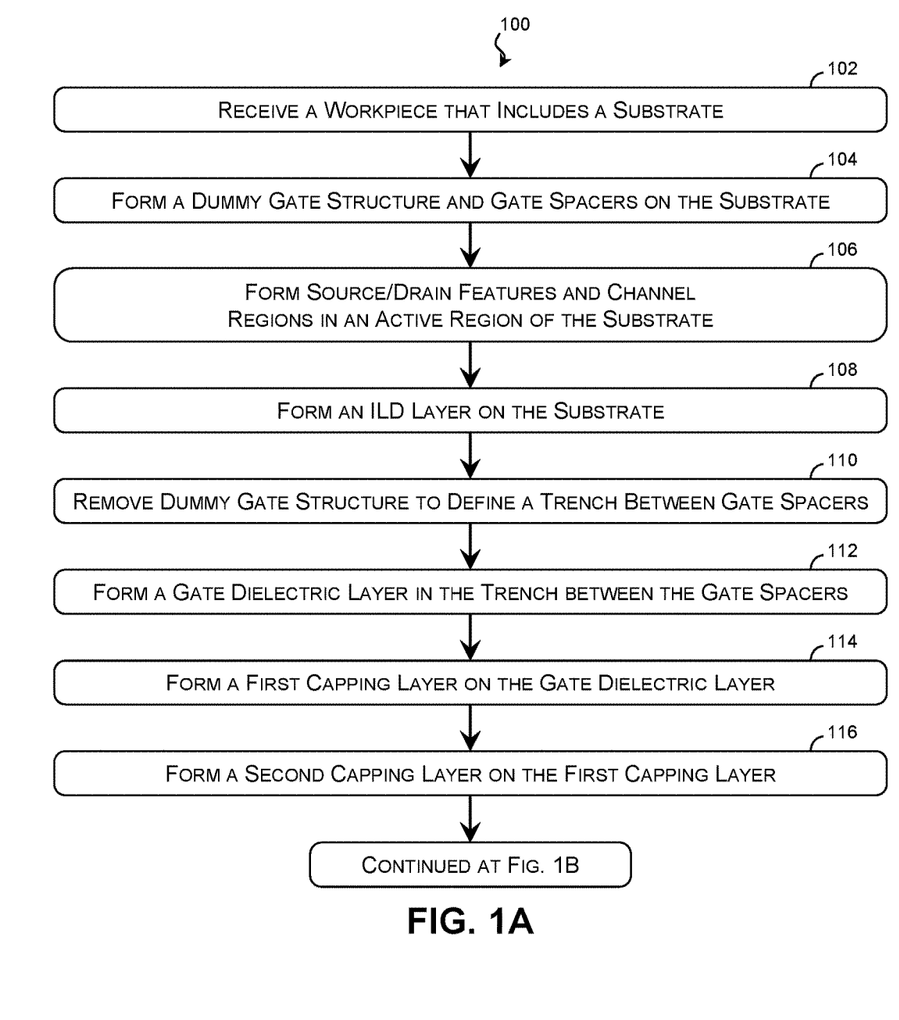
FIGS. 1A and 1B are flow diagrams of a method of forming a semiconductor device with a doped gate dielectric according to various embodiments of the present disclosure.
Figure 1B:
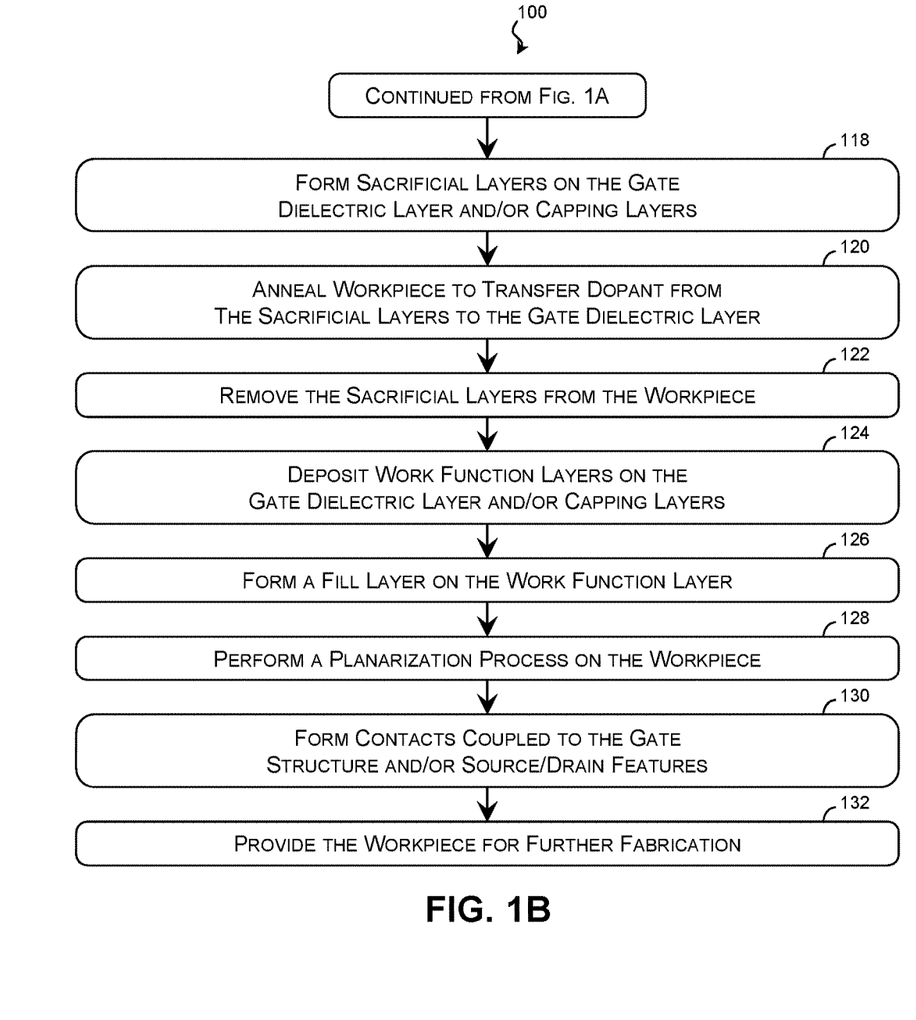

Examples of transistors, their gate structures, and a method of forming such are described with reference to FIGS. 1A-10. In that regard, FIGS. 1A and 1B are flow diagrams of a method 100 of forming a semiconductor device, such as the workpiece 200, with a doped gate dielectric according to various embodiments of the present disclosure. Additional steps can be provided before, during, and after the method 100, and some of the steps described can be replaced or eliminated for other embodiments of the method 100. FIGS. 2-10 are cross-sectional views of portions of the exemplary semiconductor workpiece 200 undergoing the method 100 of fabrication according to various embodiments of the present disclosure. FIGS. 2-10 have been simplified for the sake of clarity and to better illustrate the concepts of the present disclosure. Additional features may be incorporated into the workpiece 200, and some of the features described below may be replaced or eliminated for other embodiments of the workpiece 200. The semiconductor workpiece 200 may include a Field Effect Transistor (FET).

In various embodiments, the workpiece 200 includes a planar device or a Fin-type Field Effect Transistor (FinFET) device. A FinFET may be envisioned as a planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. Accordingly, in a FinFET example, the gate structure described below is formed to interface a plurality of sides of a fin element (e.g., semiconductor fin such as a silicon and/or silicon-germanium fin) extending from the semiconductor substrate. The illustrated workpiece 200 does not limit the embodiments to any type of devices, any number of devices, any number of regions, or any configuration of structures or regions. Furthermore, the workpiece 200 may be an intermediate device fabricated during the processing of an IC, or a portion thereof, that may comprise static random access memory (SRAM) and/or other logic circuits, passive components such as resistors, capacitors, and inductors, and active components such as n-type FETs (NFETs), p-type FETs (PFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
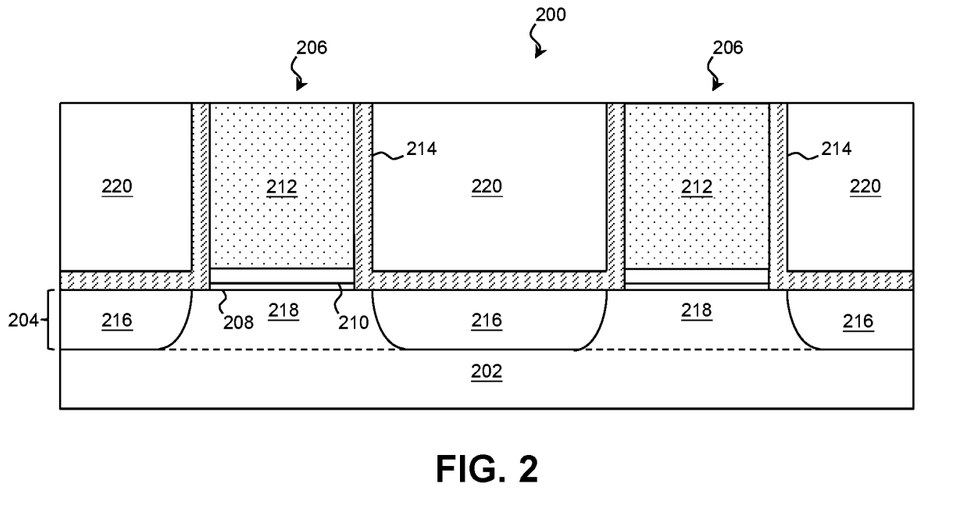
FIGS. 2-10 are cross-sectional views of portions of an exemplary semiconductor workpiece undergoing a method of fabrication according to various embodiments of the present disclosure.

Referring to block 102 of FIG. 1A and to FIG. 2, the workpiece 200 is provided. The workpiece includes a substrate 202 upon which other features are formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AnnAs, AlGaAs, GalnAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, and/or other suitable insulator materials.

The substrate 202 may include a fin extending from the remainder of the substrate 202 on and around which the gate structure described below is formed. Accordingly, the cross-sectional view of FIG. 2 may be taken through the fin of the substrate 202 and the top surface of the substrate 202 outside of the illustrated cross-section may be lower than the top surface of the substrate 202 in the cross-sectional region. The fin includes semiconductor material(s) and is suitable for forming a FinFET device thereon, such as a p-type FinFET or an n-type FinFET. The fin may be fabricated to extend from the remainder of the substrate using any suitable processes such as epitaxial growth to add material and/or etching to remove material.

The substrate 202 includes an active region 204 doped to form various operating features of the workpiece 200. In FinFET examples, the active region 204 includes at least some of the fin. Various doped regions may be formed in the active region such as source/drain features and channel regions. However in some examples, the doped regions (such as the source/drain features) are not yet formed at the time the substrate 202 is received.

The workpiece 200 may be formed by a gate-replacement or a gate-first process. In a gate replacement process, a dummy gate structure 206 is first formed on the substrate 202 and subsequently replaced with a functional gate as described in blocks 104-128 below. In a gate-first process, blocks 104-110 may be omitted and the method 100 may proceed directly to forming the gate dielectric layer (e.g., block 112) and subsequent layers (e.g., blocks 114-128) on the substrate 202 and patterning the layers to form a functional gate structure.

In a gate replacement example, referring to block 104 of FIG. 1A and referring still to FIG. 2, a dummy gate structure 206 is formed on the substrate 202 and used as a placeholder during some of the fabrication processes. Elements of the dummy gate structure 206 are subsequently removed and replaced with functional elements. This may be done when materials of the functional elements (e.g., gate electrode material, gate dielectric layer material, interfacial layer, etc.) may be damaged by some fabrication processes, such as annealing. In various examples, the dummy gate structure 206 includes an interfacial layer 208 disposed on the active region 204, a gate dielectric layer 210 disposed on the interfacial layer 208, and a dummy electrode 212 disposed on the gate dielectric layer 210.

The interfacial layer 208 may include an interfacial material, such as a semiconductor oxide, semiconductor nitride, semiconductor oxynitride, other semiconductor dielectrics, other suitable interfacial materials, and/or combinations thereof. The interfacial layer 208 may be formed to any suitable thickness using any suitable process including thermal growth, Atomic Layer Deposition (ALD), Chemical Vapor Deposition (CVD), High-Density Plasma CVD (HDP-CVD), Physical Vapor Deposition (PVD), spin-on deposition, and/or other suitable deposition processes.

The gate dielectric layer 210 may be formed on the interfacial layer 208 or may be formed directly on the active region 204 of the substrate 202. The gate dielectric layer 210 may be a placeholder material or may be the final gate dielectric itself. Accordingly, in some embodiments, the gate dielectric layer 210 is a placeholder dielectric layer that is subsequently removed when removing the dummy electrode 212 and another gate dielectric layer (e.g., layer 402 of FIG. 4) is formed in the resultant trench. In some embodiments, the gate dielectric layer 210 is the gate dielectric layer for the final workpiece 200 and is not replaced. In other words, in such embodiments, the gate dielectric layer 210 is the same layer as gate dielectric 402, discussed below and the passivation processes described below are performed upon the gate dielectric layer 210.

The gate dielectric layer 210 may include one or more dielectric materials, which are commonly characterized by their dielectric constant relative to silicon dioxide. In some embodiments, the gate dielectric layer 210 includes a high-k dielectric material, such as HfLaO, $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric layer 210 may include other dielectrics, such as a semiconductor oxide, semiconductor nitride, semiconductor oxynitride, semiconductor carbide, amorphous carbon, tetraethylorthosilicate (TEOS), other suitable dielectric material, and/or combinations thereof. In examples where the gate dielectric layer 210 is a placeholder, it may include polysilicon and/or a dielectric material. The gate dielectric layer 210 may be formed to any suitable thickness using any suitable process including ALD, CVD, HDP-CVD, PVD, and/or other suitable deposition processes.

The dummy electrode 212 is formed on the gate dielectric layer 210. As noted above, the dummy electrode 212 and/or gate dielectric layer 210 may be placeholders. A placeholder dummy electrode 212 may include polysilicon, dielectric material, and/or other suitable materials. The dummy electrode 212 may be formed to any suitable thickness using any suitable process including ALD, CVD, HDP-CVD, PVD, and/or other suitable deposition processes.

Referring to still to block 104, gate spacers 214 are formed on sidewalls of the dummy gate structure 206. The inner sidewalls of the gate spacers 214 define a trench when and if elements of the dummy gate structure 206 are removed as discussed below. The gate spacers 214 may include one or more layers of a semiconductor oxide, semiconductor nitride, semiconductor oxynitride, other semiconductor dielectrics, other suitable dielectric materials, and/or combinations thereof. The material(s) of the gate spacers 214 may be selected to have different etchant sensitivities than the materials of the dummy gate structure (e.g., the dummy electrode, the gate dielectric layer 210, the interfacial layer 208, etc.). In an example, the gate spacers 214 are formed to include a layer of silicon oxide disposed on a layer of silicon nitride disposed on a layer of silicon oxide. The gate spacers 214 may be formed to any suitable thickness by any suitable process including CVD, ALD, PVD, and/or other suitable deposition techniques.

Referring to block 106 of FIG. 1A, source/drain features 216 may be formed in the active region 204 with a channel regions 218 disposed therebetween. In some examples, an etching process is performed on the active region 204 of the substrate 202 to create recesses in which to form the source/drain features 216. The etching process may be performed using any suitable etching method, such as wet etching, dry etching, Reactive Ion Etching (RIE), ashing, and/or other etching methods and may use any suitable etchant chemistries. The etching methods and the etchant chemistries may be selected to avoid significant etching of the gate spacers 214, dummy gate structure 206, and the portion of the active region directly underneath the gate structure (i.e., the channel region 218).

An epitaxy process may be performed on the workpiece 200 to grow the source/drain features 216 within the recesses. In various examples, the epitaxy process includes a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the substrate 202 (e.g., silicon) to form the source/drain features 216. The resultant source/drain features 216 may be in-situ doped to include p-type dopants, such as boron or $BF_2$; n-type dopants, such as phosphorus or arsenic; and/or other suitable dopants including combinations thereof. Additionally or in the alternative, the source/drain features 216 may be doped using an implantation process (i.e., a junction implant process) after the source/drain features 216 are formed. Once the dopant(s) are introduced, a dopant activation processes, such as Rapid Thermal Annealing (RTA) and/or a laser annealing processes, may be performed to activate the dopants within the source/drain features 216.

Referring to block 108 of FIG. 1A and referring still to FIG. 2, an Inter-Level Dielectric (ILD) layer 220 is formed on the substrate 202. The ILD layer 220 may be the first of many such layers that support and isolate conductive traces of an electrical multi-level interconnect structure that electrically interconnects elements of the workpiece 200, such as the source/drain features 216 and the final gate electrode. The ILD layer 220 may comprise a dielectric material (e.g., a semiconductor oxide, a semiconductor nitride, a semiconductor oxynitride, a semiconductor carbide, etc.), Spin-On-Glass (SOG), fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. The ILD layer 220 may be formed by any suitable process including CVD, Plasma Enhanced CVD (PECVD), PVD, spin-on deposition, and/or other suitable processes.

In some embodiments, the ILD layer 220 is deposited and subsequently a planarization process, such as a Chemical Mechanical Polish/Planarization (CMP), is performed to expose a top surface of the dummy gate structure 206. In an embodiment, the workpiece 200 further includes an etch stop layer (not shown) underneath the ILD layer 220 and the etch stop layer may comprise silicon nitride, silicon oxide, silicon oxynitride, and/or other materials. The etch stop layer may be referred to as a Contact Etch Stop Layer (CESL).

Figure 3:
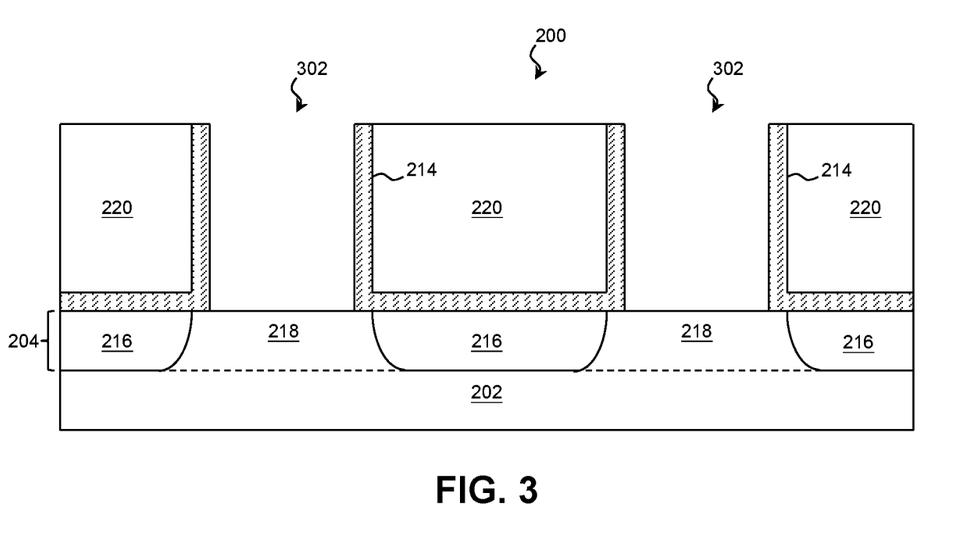

Referring to block 110 of FIG. 1A and to FIG. 3, the dummy gate structure 206 is removed thereby creating a trench 302. Again, this step is indicative of an embodiment of the method 100 that includes a gate-replacement process.

In various embodiments the gate-replacement process removes the dummy electrode 212, the gate dielectric layer 210, and/or the interfacial layer 208. Accordingly, in the illustrated embodiment of FIG. 3, the dummy electrode 212, the gate dielectric layer 210, and interfacial layer 208 are removed in the trench 302. In other embodiments, the gate dielectric layer 210 and/or the interfacial layer 208 may remain within the trench 302 and subsequent layers are formed thereon. The remaining gate spacers 214 define a gate trench 302 where the dummy gate structure 206 was removed.

Figure 4:
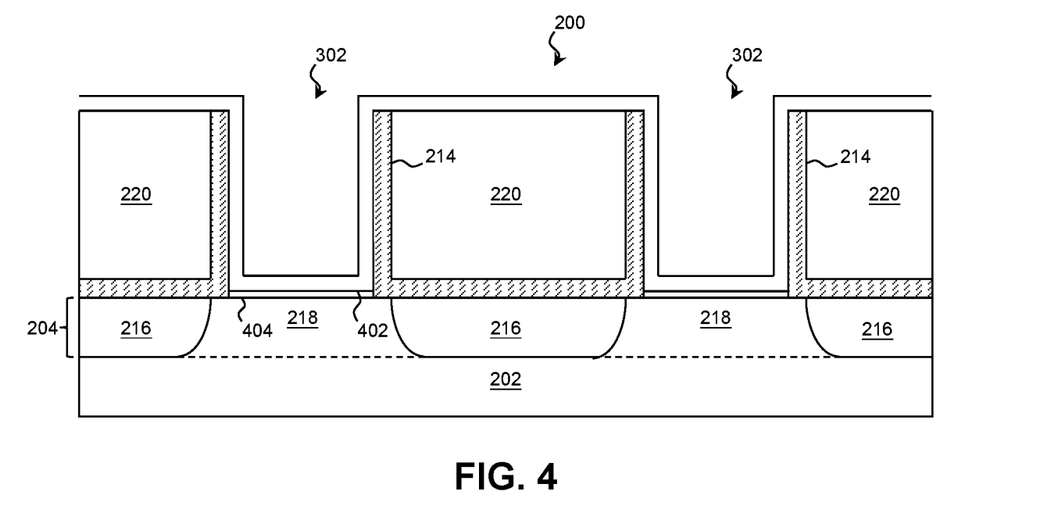

Referring to block 112 of FIG. 1A and to FIG. 4, a gate dielectric layer 402 is formed on the channel region 218. As discussed above, in a gate replacement process where the placeholder gate dielectric layer 210 is removed, the gate dielectric layer 402 may be deposited in the trench 302 defined by removal of the placeholder dummy gate structure 206. In a gate-first example and gate-replacement example where the gate dielectric layer 210 is maintained (even if the dummy electrode 212 is removed), the gate dielectric layer 402 may be substantially the same as the gate dielectric layer 210 of FIG. 2. Accordingly, in some embodiments, gate dielectric layer 402 is provided by gate dielectric layer 210.

Forming the gate dielectric layer 402 may include forming an interfacial layer 404 over the channel region 218 in the trench 302 before depositing the gate dielectric layer 402. The interfacial layer 404 may include a dielectric material such as a semiconductor oxide, semiconductor nitride, semiconductor oxynitride, other semiconductor dielectrics, other suitable interfacial materials, and/or combinations thereof. The interfacial layer 404 may be formed to any suitable thickness using any suitable process including thermal growth, ALD, CVD, HDP-CVD, PVD, spin-on deposition, and/or other suitable deposition processes. In an alternative embodiment, the interfacial layer 404 is omitted.

Using the example of FIG. 4, the gate dielectric layer 402 is deposited over the interfacial layer 404. In some embodiments, the gate dielectric layer 402 is extends along the interfacial layer 404 horizontally and extends along sidewall surfaces of the gate trench 302 vertically. The gate dielectric layer 402 may also extend horizontally along a top surface of the ILD layer 220. In another embodiment, the gate dielectric layer 402 does not extend vertically up the sidewalls of the gate spacers 214 but is shaped similar to the gate dielectric layer 210 above. The gate dielectric layer 402 may include a high-k dielectric material such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable metal-oxides, or combinations thereof. The gate dielectric layer 402 may be formed by ALD and/or other suitable methods.

As formed, the gate dielectric layer 402 may have a defect density for example, provided by oxygen vacancies in the dielectric material. These defects can contribute to threshold voltage variations and may impair the reliability of the device. Passivating these vacancies may be desired, as discussed in further detail below. In some embodiments, the passivation of the gate dielectric layer is performed by driving atoms (e.g., fluorine) from an overlying sacrificial layer to the gate dielectric layer to fill the vacancies.

In some embodiments, the method 100 includes forming one or more protective layers over the gate dielectric layer 402 including, for example, capping layers. Referring to block 114 of FIG. 1A and to FIG. 5, a first capping layer 502 is deposited on the gate dielectric layer 402. The first capping layer 502 may include a metal, a metal oxide, a metal nitride, a metal oxynitride, a metal carbide, another metal compound, a dielectric material such as a semiconductor oxide, semiconductor nitride, semiconductor oxynitride, semiconductor carbide, other semiconductor dielectrics, and/or combinations thereof. The first capping layer 502 may be formed to any suitable thickness using any suitable process including ALD, CVD, and/or other suitable deposition processes. In various examples, the first capping layer 502 includes TiN deposited by ALD to a thickness between about 10 Angstroms and about 30 Angstroms. In various examples, the first capping layer 502 includes TiSiN deposited by ALD to a thickness between about 10 Angstroms and about 30 Angstroms. The first capping layer 502 may be deposited substantially conformally and may extend along the vertical side surfaces of the gate dielectric layer 402 within the trench 302.

Figure 5:
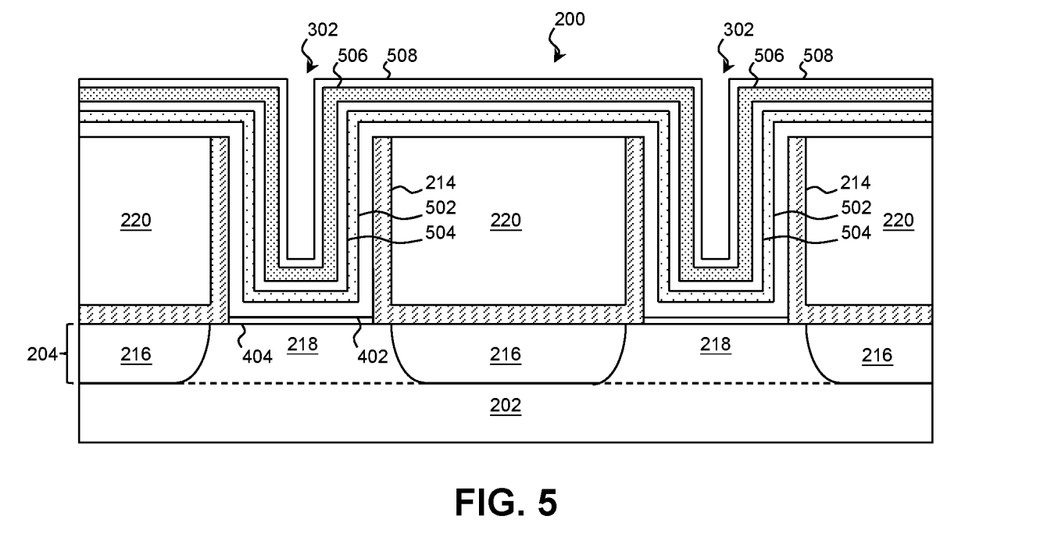

Referring to block 116 of FIG. 1A and to FIG. 5, a second capping layer 504 is deposited on the first capping layer 502. The second capping layer 504 may include a metal, a metal oxide, a metal nitride, a metal oxynitride, a metal carbide, another metal compound, a dielectric material such as a semiconductor oxide, semiconductor nitride, semiconductor oxynitride, semiconductor carbide, other semiconductor dielectrics, and/or combinations thereof. The second capping layer 504 may be formed to any suitable thickness using any suitable process including ALD, CVD, and/or other suitable deposition processes. In various examples, the second capping layer 504 includes TaN deposited by ALD to a thickness between about 10 Angstroms and about 30 Angstroms. The second capping layer 504 may be deposited substantially conformally and may extend along the vertical side surfaces of the first capping layer 502 within the trench.

Referring to block 118 of FIG. 1B and referring still to FIG. 5, one or more dopant-containing sacrificial layer(s) are formed over the gate dielectric layer 402 and/or the capping layers 502 and 504. The sacrificial layer(s) may be sacrificial in that the layer(s) are subsequently removed from the workpiece 200.

In some embodiments, block 118 includes forming a first sacrificial layer 506 containing a dopant to be introduced into the gate dielectric layer 402. In some such embodiments, the dopant includes fluorine, and the first sacrificial layer has a composition that includes a metal and fluorine (MxFy), also referred to as a metal fluoride composition. Suitable metals for fluorinated metal compositions include, but are not limited to, tungsten, aluminum, titanium, tantalum, and/or other metals. Accordingly, in an embodiment, the first sacrificial layer includes tungsten fluoride ($WF_6$). In an embodiment, the first sacrificial layer 506 is an $AlF_3$ layer. In an embodiment, the first sacrificial layer 506 is a $TaF_5$ layer. In an embodiment, the first sacrificial layer 506 is a $TiF_4$ layer. The first sacrificial layer 506 may be formed by ALD, CVD, and/or other suitable processes. In an embodiment, the first sacrificial layer 506 is formed using an ALD process to deposit tungsten fluoride at a deposition temperature between about 300° C. and about 350° C. at a pressure between about 5 Torr and about 10 Torr using $WF_6$ and $SiH_4$ precursors.

The first sacrificial layer 502 may also be formed by depositing a metal-containing layer and treating the deposited layer with a dopant-containing gas to introduce the dopant. In some embodiments, the first sacrificial layer 502 is formed by depositing TiN and/or TiAlC using an ALD process at deposition temperature between about 400° C. and about 450° C. at a pressure between about 5 Torr and about 30 Torr using $TiCl_4$ and either $NH_3$ or TEAL ($Al_2(C_2H_5)_6$) precursors. Fluorine is then introduced to the first sacrificial layer 502 by treatment with $NH_3$ and $NF_3$ at a temperature between about 30° C. and about 90° C. for between about 10 seconds and about 200 seconds and subsequently annealing the first sacrificial layer at a temperature between about 200° C. and about 400° C.

The first sacrificial layer 506 including the metal fluoride composition may be between about 10 Angstroms and about 20 Angstroms in thickness. In some embodiments, the thickness of the first sacrificial layer 506 and/or the amount of dopant therein is selected to provide a suitable quantity of the dopant to the gate dielectric layer 402.

In some embodiments, block 118 includes forming a second sacrificial layer 508 over the first sacrificial layer 506. The second sacrificial layer 508 may be a blocking layer, and may include a metal, a metal oxide, a metal nitride, a metal oxynitride, a metal carbide, another metal compound, a semiconductor dielectric, and/or combinations thereof. In various embodiments, the second sacrificial layer 508 includes TiN, SiN, and/or AlN. The second sacrificial layer 508 may be formed by ALD, CVD, and/or other suitable processes. In an embodiment, the second sacrificial layer 508 is formed using an ALD process to deposit TiN at a deposition temperature between about 400° C. and about 450° C. at a pressure between about 5 Torr and about 30 Torr using $TiCl_4$ and $NH_3$ precursors. The second sacrificial layer may be between approximately 10 and 15 Angstroms in thickness. In other embodiments, the second sacrificial layer 508 is omitted.

The passivation process of method 100 may be performed on all of the devices on the workpiece 200 or on a subset thereof. For example, in some embodiments, the first sacrificial layer 506 and the second sacrificial layer 508 are only formed on a subset of the devices (e.g., exclusively on the NFET devices) so that the passivating dopant is only introduced to the gate structures of the devices in the subset.

After deposition of one or more of the first capping layer 502, the second capping layer 504, the first sacrificial layer 506, and/or the second sacrificial layer 508, a planarization process (or multiple processes between the deposition steps) may be performed that removes a layer from a top surface of the gate dielectric layer 402, while maintaining the first capping layer 502, the second capping layer 504, the first sacrificial layer 506, and/or the second sacrificial layer 508 within the gate trench 302.

Figure 6:
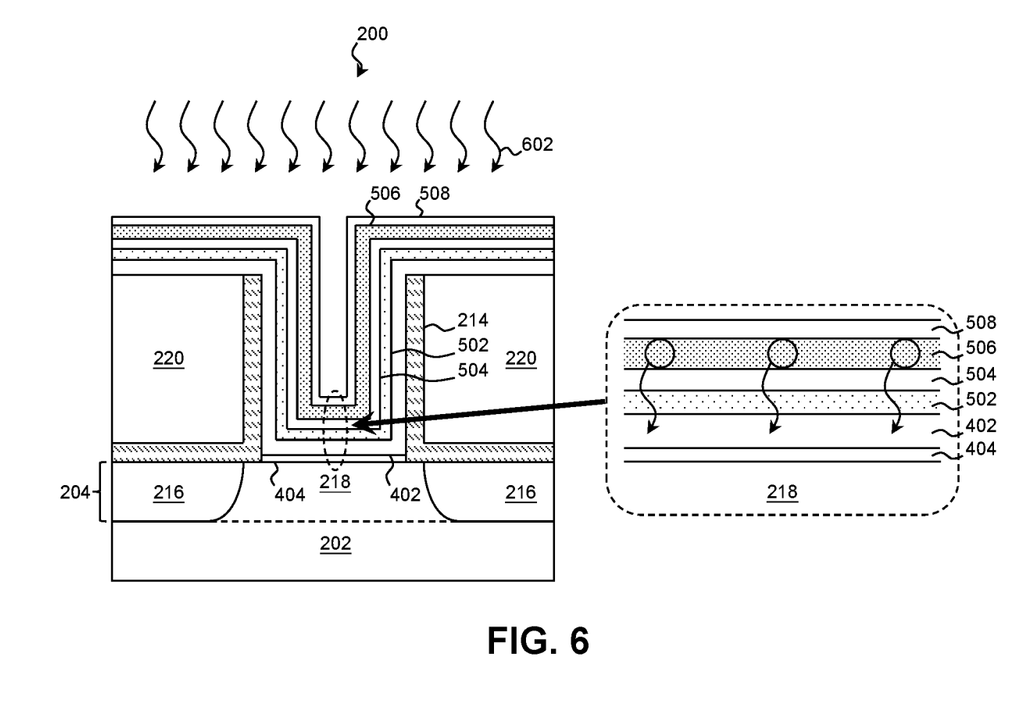

Referring to block 120 of FIG. 1B and to FIG. 6, a high temperature process is performed. The high temperature process is a process having a greater than room temperature exposure of the substrate sufficient to cause migration or movement of atoms from one layer to another in the formed layers. The high temperature process can drive-in element(s) from certain layers on the stack into underlying layers including the gate dielectric layer. In an embodiment, the dopant from the first sacrificial layer 506 (e.g., fluorine in the case of a metal fluoride layer such as a tungsten fluoride layer) is driven into the gate dielectric layer 402. It is noted that where the first sacrificial layer 506 is separated from the gate dielectric layer 402 by an intervening layer (e.g., the first capping layer 502 and/or the second capping layer 504), the high temperature process is configured to drive the dopant through the intervening layers and into the gate dielectric layer 402. In an embodiment, another dopant (e.g., nitrogen) is also driven in from one of the first sacrificial layer 506, the second sacrificial layer 508, or an ambient present during the high temperature process. The dopant(s) (e.g., fluorine and/or nitrogen) can serve to passivate the gate dielectric layer 402, thereby reducing the oxygen vacancies.

The high temperature process may be a thermal anneal (e.g., rapid thermal anneal) and may be performed at any suitable temperature for any suitable duration. In various such embodiments, a rapid thermal anneal is performed at a temperature between about 550° C. and about 600° C. for between about 10 second and about 50 seconds. The annealing process may be provided in a vacuum environment. In another embodiment, the annealing process may be provided in a nitrogen ambient. The parameters of the anneal process (e.g., temperature, duration, etc.) may be selected to provide suitable movement of the dopant to the gate dielectric layer 402.

Referring to the example of FIG. 6, anneal conditions 602 (e.g., heat) are provided to the substrate 202. As illustrated by the offset in FIG. 6, dopant from the first sacrificial layer 506 is driven in from the first sacrificial layer 506 to the gate dielectric layer 402. Thus, the composition of the gate dielectric layer 402 includes the dopant after the anneal 602. The dopant may fill vacancies provided in the as-deposited gate dielectric layer 402. The final amount of dopant in the gate dielectric layer 402 may depend on the thickness and/or composition of the first sacrificial layer 506 as well as the parameters of the annealing process. In this way, the gate dielectric layer 402 may have a higher dopant concentration than can be achieved using a permanent dopant source (as opposed to a sacrificial layer) or other implantation process, and in some such embodiments, the amount of dopant in the gate dielectric layer 402 may meet or exceed 4 atomic percent. The thickness of the gate dielectric layer 402 may remain substantially constant before and after the anneal conditions 602. In some embodiments, other dopants transfer from one or more of the layers 506 and/or 508 and/or the ambient annealing environment into the gate dielectric layer 402.

Figure 7:
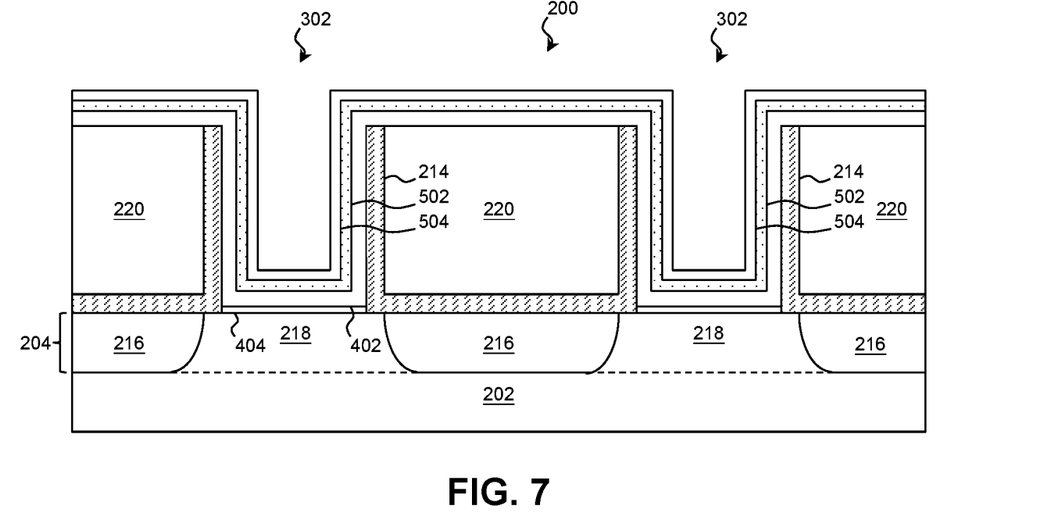

Referring to block 122 of FIG. 1B and to FIG. 7, the sacrificial layer(s) (e.g., sacrificial layers 506 and 508) are removed. The sacrificial layer(s) may be removed by wet etching, dry etching, RIE, and/or other suitable etching techniques using any suitable etchant chemistry. In some examples, the etching technique and etchant is selected to avoid substantial etching of the gate dielectric layer 210 and/or the capping layers 502 and 504. In some such examples, the sacrificial layer 506 and/or 508 are removed by wet etching using a phosphoric acid and peroxide solution ($H_3PO_4/H_2O_2/H_2O$) for between about 50 seconds and about 100 seconds.

Figure 8:
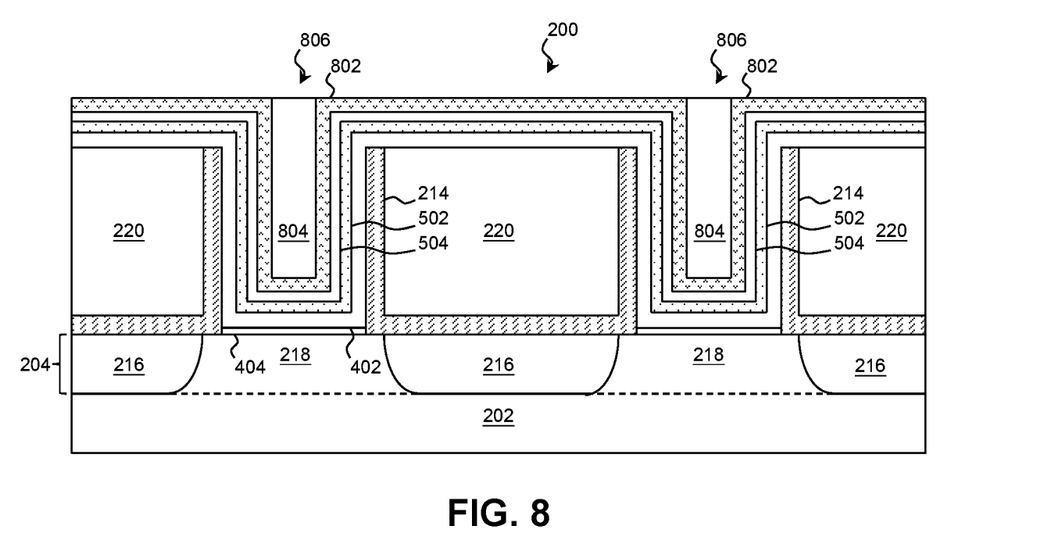

Referring to block 124 of FIG. 1B and to FIG. 8, one or more Work Function (WF) metal layers (collectively layer 802) are formed on the gate dielectric layer 210 and/or any capping layers (e.g., layers 502 and 504) formed thereupon. For example, in various embodiments, between two and six metal work function layers are formed. However, any number of work function layers is understood to be within the scope of the present discussion. In an embodiment, the method 100 deposits the WF layer(s) 802 over the bottom and sidewalls of the gate trench after removal of the sacrificial layers (e.g., layers 506 and 508 above). The WF layer(s) 802 are deposited over the gate dielectric layer 402 and partially fill the gate trench.

The WF layer(s) 802 may include n-type or p-type work function layers depending on the type of device being formed on the workpiece 200. Suitable materials for an n-type work function layer include a metal with a sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. Suitable materials for a p-type work function layer include a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The gate WF layer(s) 802 may include a plurality of layers each providing a suitable n-type or p-type work function for the resultant gate, and each of the WF layers 802 may have a different composition. The gate WF layer(s) 802 may be deposited by ALD, CVD, PVD, and/or other suitable processes.

Referring to block 126 of FIG. 1B and to FIG. 8, a fill layer (filling layer) 804 is deposited on the WF layer(s) 802. The fill layer 804 may fill any remaining space left in the gate trench 302. The fill layer 804 may include any suitable conductor including aluminum (Al), tungsten (W), cobalt (Co), copper (Cu), compounds thereof and/or other suitable materials. The fill layer 804 may be deposited by CVD, PVD, ALD, plating, and/or other suitable processes. At this point, the gate structure contains a functional interfacial layer 404, gate dielectric layer 402, and electrode (e.g., WF layer(s) 802, fill layer 804, and/or other conductive layers) as opposed to the components of the dummy gate structure 206, and gate structure with the functional components is designated functional gate structure 806.

Figure 9:
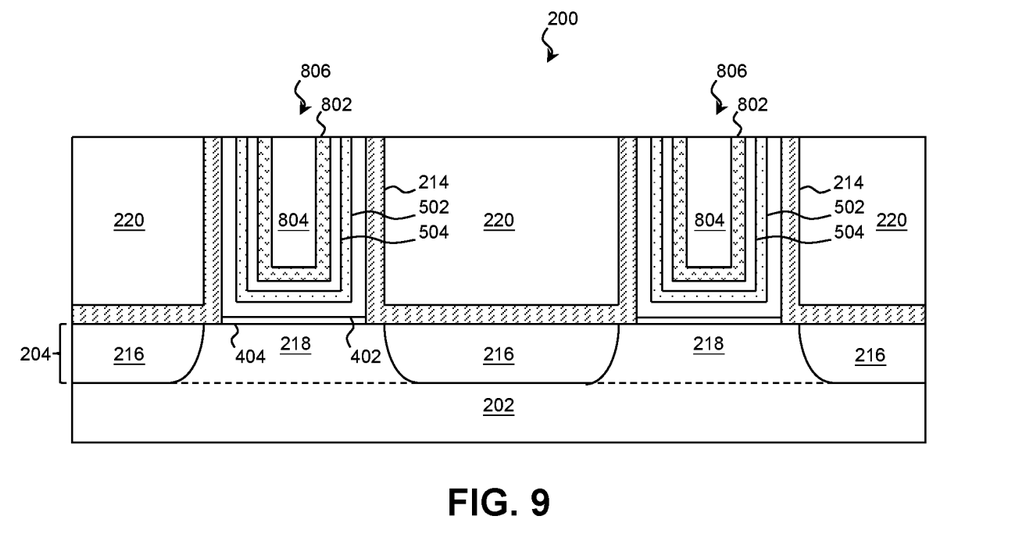

Referring to block 128 of FIG. 1B and to FIG. 9, a CMP process is performed that removes excessive metal material outside of the gate trench and planarizes a top surface of the workpiece 200. As a result, a top surface of the fill layer 804 may be substantially coplanar with the surface of the ILD layer 220.

Figure 10:
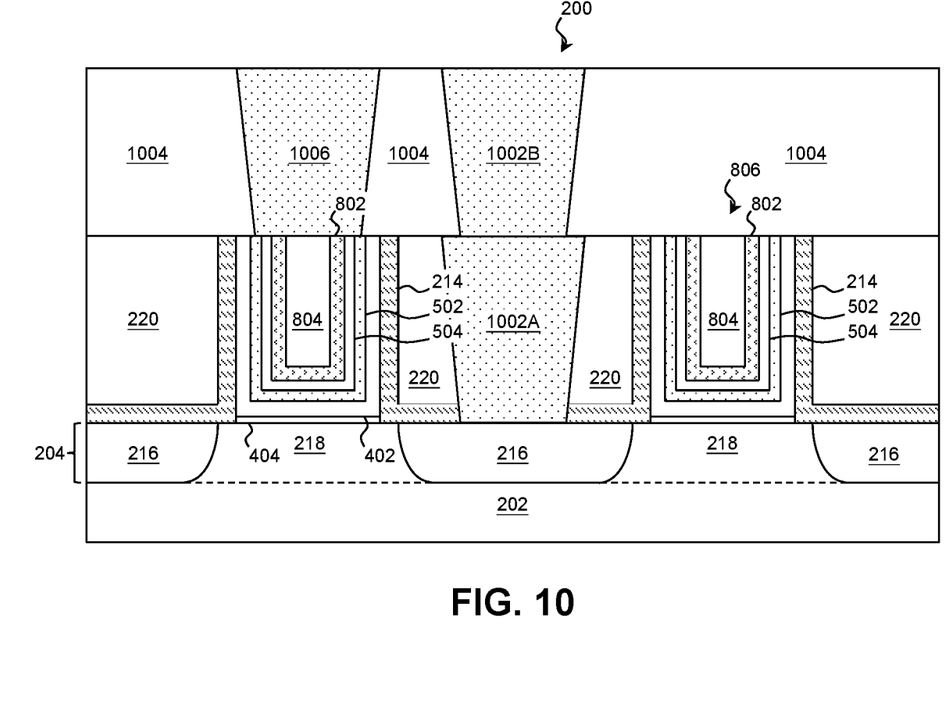

Referring to block 130 of FIG. 1B and to FIG. 10, contacts are formed. In some such examples, this includes a photolithographic process to selectively expose portions of the ILD layer to etch. The ILD layer 220 is then etched to expose the source/drain features 216, and a first portion 1002A of a source/drain contact is formed within the recess extending through the ILD layer 220 and electrically coupled to at least one of the source/drain features 216. A CMP process may be performed to planarize the first portion 1002A of the source/drain contact.

A second ILD layer 1004 may be deposited on the first ILD layer 220. Another photolithographic process may be used to selectively expose portions of the second ILD layer 1004 to etch. The second ILD layer 1004 may include a dielectric material similar to that of the ILD layer 220 and may be deposited by a spin-on process, a PECVD process, a CVD process, and/or other suitable deposition techniques. The second ILD layer 1004 is then etched to expose the first portion 1002A of the source/drain contact and the top surface of the functional gate structure 806. A second portion 1002B of the source/drain contact is formed extending through the second ILD layer 1004 and electrically coupled to the first portion 1002A. A gate contact 1006 is formed extending through the second ILD layer 1004 and electrically coupled to the functional gate structure 806 (e.g., the fill layer 804, the WF layer(s) 802, the first capping layer 502, the second capping layer 504, etc.). A CMP process may be performed to planarize the second portion 1002B of the source/drain contact and the gate contact 1006.

In an embodiment, the first and second portions 1002A and 1002B of the source/drain contact and the gate contact 1006 each include a barrier layer and a metal via layer over the barrier layer. The barrier layer may comprise tantalum (Ta), tantalum nitride (TaN), or another suitable metal-diffusion barrier material, and may be deposited using CVD, PVD, ALD, or other suitable processes. The metal via layer may include a conductive material such as copper (Cu), aluminum (Al), tungsten (W), cobalt (Co), combinations thereof, and/or other suitable material; and may be deposited using a suitable process, such as CVD, PVD, plating, and/or other suitable processes.

Referring to block 132 of FIG. 1B, the workpiece 200 may be provided for further fabrication processes.

Figure 11:
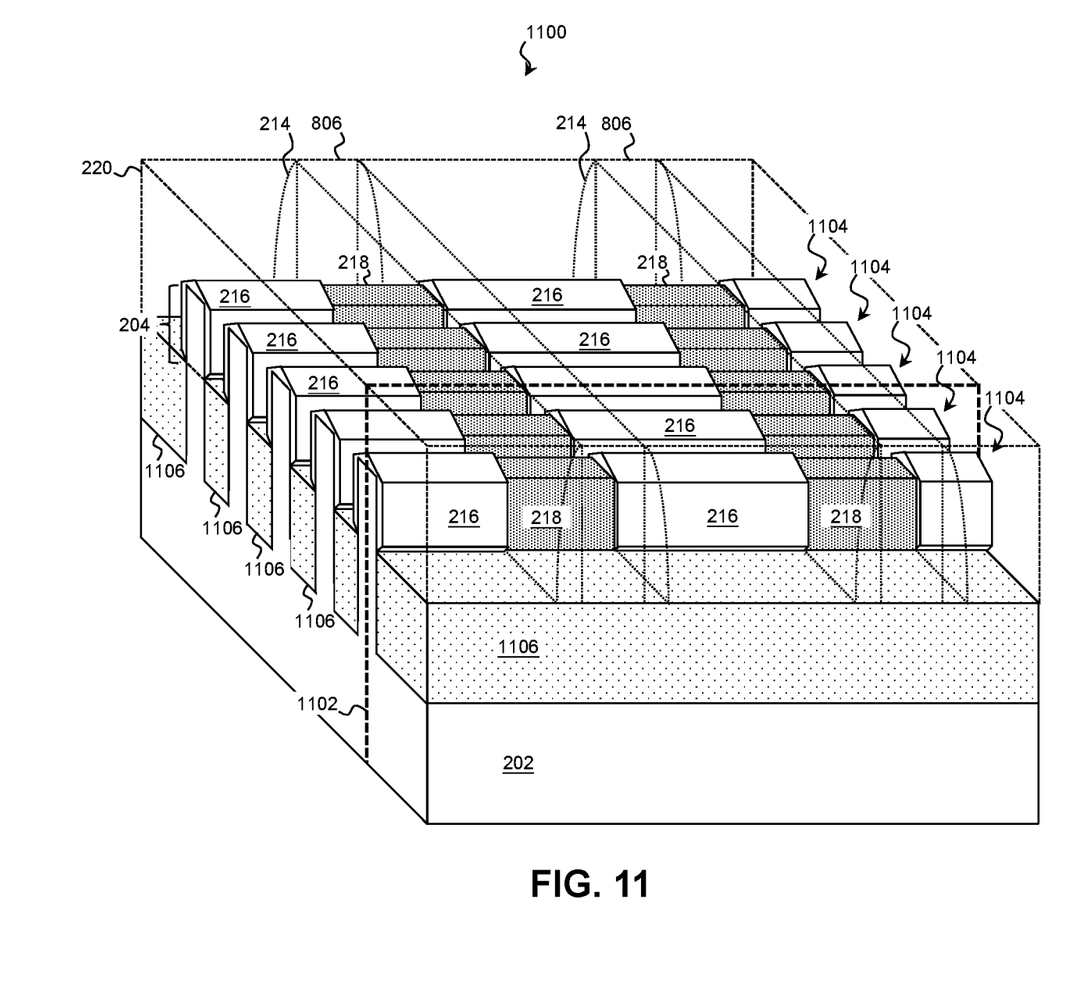
FIG. 11 is a perspective view of a workpiece with a doped gate dielectric according to various embodiments of the present disclosure.

Some of the above examples are shown in more detail in the context of FIG. 11. In that regard, FIG. 11 is a perspective view of a workpiece 1100 with the doped gate dielectric according to various embodiments of the present disclosure. The workpiece 1100 may be substantially similar to workpiece 200 of FIGS. 2-10 above in many aspects, and the corresponding cross-sectional plane of FIGS. 2-10 is indicated by marker 1102.

The workpiece 1100 includes a substrate 202 substantially as described above with one or more device fins 1104 formed upon it.

The device fins 1104 are representative of any raised feature, and while the illustrated embodiments include FinFET device fins 1104, further embodiments include other raised active and passive devices formed upon the substrate 202. In some embodiments, the FinFET device fins 1104 include an active region 204 that contains a pair of opposing source/drain features 216 separated by a channel region 218 substantially as described above. The flow of carriers (electrons for an n-channel FinFET and holes for a p-channel FinFET) through the channel region 218 is controlled by a voltage applied to a gate structure 806 adjacent to and overwrapping the channel region 218. The gate structure 806 may be formed as described in the context FIGS. 1A-10 and may include a high-k gate dielectric that contains a dopant such as fluorine. However for clarity, individual elements of the gate structure 806 are represented by a single merged shape, and the gate structure 806 is shown as translucent to better illustrate the underlying channel region 218.

The lower portions of the device fins 1104 are separated by isolation features 1106, such as shallow trench isolation features, that may include a dielectric such as a semiconductor oxide, a semiconductor nitride, a semiconductor oxynitride, another semiconductor dielectric, and/or other suitable materials and combinations thereof. The upper portions of the device fins 1104 are separated by an ILD layer 220, which may be substantially as described above. The ILD layer 220 is shown as translucent to better illustrate the underlying elements.

Thus, the present disclosure provides examples of an integrated circuit with a gate structure and a method for forming the integrated circuit. In some embodiments, a method includes receiving a workpiece that includes a substrate having a channel region. A gate dielectric is formed on the channel region, and a layer containing a dopant is formed on the gate dielectric. The workpiece is annealed to transfer the dopant to the gate dielectric, and the layer is removed after the annealing. In some such embodiments, after the layer is removed, a work function layer is formed on the gate dielectric and a fill material is formed on the work function layer. In some such embodiments, a first capping layer is formed on the gate dielectric such that the layer containing the dopant is formed on the first capping layer and the annealing of the workpiece transfers the dopant through the first capping layer. In some such embodiments, a second capping layer is formed on the first capping layer such that the layer containing the dopant is formed on the second capping layer and the annealing of the workpiece further transfers the dopant through the second capping layer. In some such embodiments, a blocking layer is formed on the layer containing the dopant prior to the annealing of the workpiece. In some such embodiments, a dummy gate structure is formed on the channel region, and gate spacers are formed on side surfaces of the dummy gate structure. The dummy gate structure is removed such that a trench is defined between the gate spacers, and the forming of the gate dielectric forms the gate dielectric within the trench. In some such embodiments, the workpiece includes an inter-level dielectric disposed on the substrate and the gate dielectric is disposed directly on a top surface of the inter-level dielectric during the annealing. In some such embodiments, the dopant includes fluorine and the layer containing the dopant further contains a metal from a group consisting of: tungsten, aluminum, titanium, and tantalum. In some such embodiments, the annealing of the workpiece includes performing a rapid thermal anneal at a temperature between about 550° C. and about 600° C. In some such embodiments, the rapid thermal anneal is performed for between about 10 second and about 50 seconds.

In further embodiments, a method includes receiving a substrate having a pair of source/drain features, a channel region between the pair of source/drain features, and a dummy gate structure on the channel region. The dummy gate structure is removed to define a trench over the channel region, and a high-k gate dielectric is formed within the trench on the channel region. A layer containing fluorine is formed on the high-k gate dielectric, and a thermal process is performed to transfer the fluorine from the layer to the high-k gate dielectric. The layer is removed after the performing of the thermal process. In some such embodiments, a gate structure that includes the high-k gate dielectric is formed after the removing of the layer. In some such embodiments, the forming of the layer containing fluorine is performed using an atomic layer deposition process at a deposition temperature between about 300° C. and about 350° C. at a pressure between about 5 Torr and about 10 Torr. In some such embodiments, the layer containing fluorine is formed to a thickness between approximately 10 and 20 Angstroms. In some such embodiments, a blocking layer is formed on the layer containing fluorine prior to the thermal process. In some such embodiments, the blocking layer includes a material from a group consisting of TiN, SiN, and AlN.

In yet further embodiments, a method includes depositing a gate dielectric on a substrate and depositing a sacrificial layer containing tungsten fluoride on the gate dielectric. An annealing process is performed to transfer fluorine from the sacrificial layer to the gate dielectric, and the sacrificial layer is removed. Thereafter, a gate structure that includes the gate dielectric with the fluorine is formed. In some such embodiments, the gate dielectric with the fluorine has a fluorine concentration of least 4 atomic percent. In some such embodiments, a first capping layer is formed on the gate dielectric such that the sacrificial layer is formed on the first capping layer and the performing of the annealing process transfers fluorine through the first capping layer. In some such embodiments, a second capping layer is formed on the first capping layer such that the sacrificial layer is formed on the second capping layer and the performing of the annealing process transfers fluorine through the second capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a workpiece that includes a substrate having a channel region;
   forming a gate dielectric on the channel region;
   forming a first layer on the gate dielectric, wherein the first layer includes tungsten fluoride;
   annealing the workpiece to transfer fluorine from the first layer to the gate dielectric; and
   removing the entire first layer from the workpiece after the annealing.

2. The method of claim 1 further comprising:
   after the removing of the first layer:
   forming a work function layer on the gate dielectric; and
   forming a fill material on the work function layer.

3. The method of claim 1 further comprising forming a first capping layer on the gate dielectric such that the first layer is formed on the first capping layer and the annealing of the workpiece transfers the fluorine through the first capping layer.

4. The method of claim 3 further comprising forming a second capping layer on the first capping layer such that the first layer is formed on the second capping layer and the annealing of the workpiece further transfers the fluorine through the second capping layer.

5. The method of claim 3, wherein the first capping layer includes a metal nitride, and wherein the annealing of the workpiece further transfers nitrogen from the first layer to the gate dielectric.

6. The method of claim 1 further comprising forming a blocking layer on the first layer prior to the annealing of the workpiece.

7. The method of claim 1 further comprising:
   forming a dummy gate structure on the channel region;
   forming gate spacers on side surfaces of the dummy gate structure; and
   removing the dummy gate structure such that a trench is defined between the gate spacers, wherein the forming of the gate dielectric forms the gate dielectric within the trench.

8. The method of claim 1, wherein:
   the workpiece includes an inter-level dielectric disposed on the substrate; and
   the gate dielectric is disposed directly on a top surface of the inter-level dielectric during the annealing.

9. The method of claim 1, wherein the annealing of the workpiece includes performing a rapid thermal anneal at a temperature between about 550° C. and about 600° C.

10. The method of claim 9, wherein the rapid thermal anneal is performed for between about 10 second and about 50 seconds.

11. A method comprising:
receiving a substrate having:
a pair of source/drain features;
a channel region between the pair of source/drain features; and
a dummy gate structure on the channel region;
removing the dummy gate structure to define a trench over the channel region;
forming a high-k gate dielectric within the trench on the channel region;
forming a layer containing tungsten fluoride on the high-k gate dielectric;
performing a thermal process to transfer the fluorine from the layer to the high-k gate dielectric; and
removing the entire layer from the substrate after the performing of the thermal process.

12. The method of claim 11 further comprising forming a gate structure that includes the high-k gate dielectric after the removing of the layer.

13. The method of claim 11, wherein the forming of the layer containing fluorine is performed using an atomic layer deposition process at a deposition temperature between about 300° C. and about 350° C. at a pressure between about 5 Torr and about 10 Torr.

14. The method of claim 11, wherein the layer containing tungsten fluoride is formed to a thickness between approximately 10 and 20 Angstroms.

15. The method of claim 11 further comprising forming a blocking layer on the layer containing tungsten fluoride prior to the thermal process.

16. The method of claim 15 wherein the blocking layer includes a material from a group consisting of TiN, SiN, and AN.

17. A method comprising:
depositing a gate dielectric on a substrate;
depositing a sacrificial layer containing tungsten fluoride on the gate dielectric;
performing an annealing process to transfer fluorine from the sacrificial layer to the gate dielectric;
removing the entire sacrificial layer; and
forming a gate structure that includes the gate dielectric with the fluorine after the removing of the sacrificial layer.

18. The method of claim 17, wherein the gate dielectric with the fluorine has a fluorine concentration of least 4 atomic percent.

19. The method of claim 17 further comprising forming a first capping layer on the gate dielectric such that the sacrificial layer is formed on the first capping layer and the performing of the annealing process transfers fluorine through the first capping layer.

20. The method of claim 19 further comprising forming a second capping layer on the first capping layer such that the sacrificial layer is formed on the second capping layer and the performing of the annealing process transfers fluorine through the second capping layer.

* * * * *